(12) United States Patent
Xiong et al.

(10) Patent No.: US 11,146,290 B1
(45) Date of Patent: Oct. 12, 2021

(54) BIT-FLIPPING METHOD FOR DECODING LDPC CODE AND SYSTEM USING THE SAME

(71) Applicant: INNOGRIT TECHNOLOGIES CO., LTD., Shanghai (CN)

(72) Inventors: Chenrong Xiong, San Jose, CA (US); Jie Chen, San Jose, CA (US); Zining Wu, San Jose, CA (US)

(73) Assignee: INNOGRIT TECHNOLOGIES CO., LTD., Shanghai (CN)

( * ) Notice: Subject to any disclaimer, the term of this patent is extended or adjusted under 35 U.S.C. 154(b) by 0 days.

(21) Appl. No.: 16/917,961

(22) Filed: Jul. 1, 2020

(51) Int. Cl.

| G11C 29/00 | (2006.01) |
| H03M 13/11 | (2006.01) |
| G06F 11/10 | (2006.01) |
| H03M 13/00 | (2006.01) |
| H03M 13/37 | (2006.01) |
| H03M 13/15 | (2006.01) |

(52) U.S. Cl.
CPC ..... *H03M 13/1108* (2013.01); *G06F 11/1068* (2013.01); *H03M 13/1575* (2013.01); *H03M 13/3746* (2013.01); *H03M 13/616* (2013.01)

(58) Field of Classification Search
CPC .......... H03M 13/1108; H03M 13/616; H03M 13/3746; H03M 13/1575; G06F 11/1068
See application file for complete search history.

(56) References Cited

U.S. PATENT DOCUMENTS

| 8,826,096 B2 | 9/2014 | Moon et al. | |
| 9,385,753 B2 * | 7/2016 | Varnica | .............. H03M 13/1108 |
| 2020/0036393 A1 * | 1/2020 | Ha | ..................... H03M 13/1125 |

* cited by examiner

*Primary Examiner* — Samir W Rizk
(74) *Attorney, Agent, or Firm* — Metis IP LLC

(57) ABSTRACT

The present disclosure provides an improved bit-flipping method and system for decoding a received LDPC codeword. The decoding process may include estimating values with respect to the bits of the received LDPC codeword by a plurality of bit nodes and check nodes. A flipping energy of a bit node may be obtained based on a function of values of check nodes connected to it. Then, a flipping reliability of the bit node may be determined by comparing the flipping energy with at least one flipping energy threshold. Further, a flipping probability of the bit node may be determined based on the flipping reliability and a flipping rule. A flipping test may be performed according to the flipping probability, and as a result, at least one target bit node that is required to be flipped may be determined and further flipped.

18 Claims, 11 Drawing Sheets

BIT-FLIPPING METHOD FOR DECODING LDPC CODE AND SYSTEM USING THE SAME

TECHNICAL FIELD

The present disclosure generally relates to low-density parity-check (LDPC) codes, and more particularly, to an improved bit-flipping decoding method for LDPC codes and a system for decoding received LDPC codewords by using the improved bit-flipping method.

BACKGROUND

LDPC codes are widely used because of its superior error correction capability. Conventionally, a bit-flipping decoder and/or a min-sum decoder are used to decode received LDPC codewords. For SSD application, usually, a received LDPC codeword is first decoded by the bit-flipping decoder due to its fast speed, high throughput, and low power consumption. If the received LDPC codeword cannot be decoded by the bit-flipping decoder, the min-sum decoder which has a better error correction capability may be used. However, the min-sum decoder is slower (and has a lower throughput) than the bit-flipping decoder. A frequent use of the min-sum decoder significantly reduces the overall decoding throughput.

Therefore, it is desirable to provide an improved bit-flipping method with a higher error correction capability so that the use of the min-sum decoder may be reduced and the overall decoding throughput may be increased.

SUMMARY

According to an aspect of the present disclosure, a system for decoding a received LDPC codeword may be provided. The system may include at least one storage device storing executable instructions, and at least one processor in communication with the at least one storage device. When executing the executable instructions, the at least one processor may cause the system to perform operations including: receiving a LDPC codeword through a channel, the received LDPC codeword including a plurality of bits; obtaining a parity check matrix defining relationships between a plurality of bit nodes and a plurality of check nodes, each bit node corresponding to one of the plurality of bits; and decoding the received LDPC codeword by estimating values with respect to the LDPC codeword at the plurality of bit nodes and the plurality of check nodes in an iterative process including one or more iterations. At least one iteration of the one or more iterations may include: determining a syndrome weight based on current values of the plurality of bit nodes and the parity check matrix; determining whether the syndrome weight is equal to zero; in response to determining that the syndrome weight is not equal to zero, determining one or more flipping reliabilities of the plurality of bit nodes, each flipping reliability representing a reliability of a flipping operation on one of the plurality of bit nodes; determining, among the plurality of bit nodes, at least one target bit node that is required to be flipped based on the one or more flipping reliabilities of the plurality of bit nodes; and flipping the at least one target bit node to update the current values of the plurality of bit nodes.

In some embodiments, the determining, among the plurality of bit nodes, at least one target bit node that is required to be flipped may include: determining one or more flipping probabilities of the plurality of bit nodes, each flipping probability corresponding to one of the plurality of bit nodes; for each of the plurality of bit nodes, performing a test according to its corresponding flipping probability to determine whether the bit node is required to be flipped, wherein in the test, the bit node may have a first probability equal to the flipping probability to be flipped; and determining the at least one target bit node that is required to be flipped according to a result of the test.

In some embodiments, the determining one or more flipping probabilities of the plurality of bit nodes may include: obtaining a flipping rule, the flipping rule including a relationship between the flipping reliability and the flipping probability of a same bit node; and for each of the plurality of bit nodes, determining the flipping probability of the bit node based on the flipping rule and the corresponding flipping reliability of the bit node.

In some embodiments, the determining one or more flipping reliabilities of the plurality of bit nodes may include: determining whether the syndrome weight is greater than a syndrome weight threshold; and in response to determining that the syndrome weight is greater than the syndrome weight threshold, designating a preset flipping reliability as the one or more flipping reliabilities of the plurality of bit nodes.

In some embodiments, the channel may provide soft information including an initial probability of each of the plurality of bit nodes, and the determining one or more flipping reliabilities of the plurality of bit nodes may include: determining whether the syndrome weight is greater than a syndrome weight threshold; and in response to determining that the syndrome weight is greater than the syndrome weight threshold, for each of the plurality of bit nodes, determining the flipping reliability of the bit node based on its initial probability.

In some embodiments, the determining one or more flipping reliabilities of the plurality of bit nodes may include: for each of the plurality of bit nodes, determining a flipping energy; obtaining at least one flipping energy threshold; comparing the flipping energy with the at least one flipping energy threshold; and determining the flipping reliability of the bit node based on a result of the comparison.

In some embodiments, for each of the plurality of bit node, the flipping energy may relate to a function of values of check nodes that are connected to the bit node.

In some embodiments, a flipping energy threshold corresponding to a specific bit node may have different values in different iterations.

In some embodiments, a value of the at least one flipping energy threshold corresponding to a specific bit node may be determined according to at least one of: an index of the specific bit node, channel mismatch information between the current hard decision and the channel input hard decision, a count of check nodes connected to the specific bit node, an iteration number, a count of the at least one target bit node in a previous iteration, the syndrome weight in a current iteration, or a syndrome weight in a previous iteration.

In some embodiments, different bit nodes may correspond to different values of the at least one flipping energy threshold.

In some embodiments, the system may be used in a solid state drive (SSD) controller for decoding a low-density parity-check (LDPC) codeword.

According to an aspect of the present disclosure, a method for decoding a received LDPC codeword may be provided. The method may include one or more operations including:

receiving a LDPC codeword through a channel, the received LDPC codeword including a plurality of bits; obtaining a parity check matrix defining relationships between a plurality of bit nodes and a plurality of check nodes, each bit node corresponding to one of the plurality of bits; and decoding the received LDPC codeword by estimating values with respect to the LDPC codeword at the plurality of bit nodes and the plurality of check nodes in an iterative process including one or more iterations. At least one iteration of the one or more iterations may include: determining a syndrome weight based on current values of the plurality of bit nodes and the parity check matrix; determining whether the syndrome weight is equal to zero; in response to determining that the syndrome weight is not equal to zero, determining one or more flipping reliabilities of the plurality of bit nodes, each flipping reliability representing a reliability of a flipping operation on one of the plurality of bit nodes; determining, among the plurality of bit nodes, at least one target bit node that is required to be flipped based on the one or more flipping reliabilities of the plurality of bit nodes; and flipping the at least one target bit node to update the current values of the plurality of bit nodes.

According to an aspect of the present disclosure, a non-transitory computer readable medium including executable instructions for decoding a received LDPC codeword may be provided. When executed by at least one processor, the executable instructions may direct the at least one processor to perform a method include one or more operations including: receiving a LDPC codeword through a channel, the received LDPC codeword including a plurality of bits; obtaining a parity check matrix defining relationships between a plurality of bit nodes and a plurality of check nodes, each bit node corresponding to one of the plurality of bits; and decoding the received LDPC codeword by estimating values with respect to the LDPC codeword at the plurality of bit nodes and the plurality of check nodes in an iterative process including one or more iterations. At least one iteration of the one or more iterations may include: determining a syndrome weight based on current values of the plurality of bit nodes and the parity check matrix; determining whether the syndrome weight is equal to zero; in response to determining that the syndrome weight is not equal to zero, determining one or more flipping reliabilities of the plurality of bit nodes, each flipping reliability representing a reliability of a flipping operation on one of the plurality of bit nodes, each flipping reliability corresponding to a flipping probability; determining, among the plurality of bit nodes, at least one target bit node that is required to be flipped based on the one or more flipping reliabilities of the plurality of bit nodes; and flipping the at least one target bit node to update the current values of the plurality of bit nodes.

Additional features will be set forth in part in the description which follows, and in part will become apparent to those skilled in the art upon examination of the following and the accompanying drawings or may be learned by production or operation of the examples. The features of the present disclosure may be realized and attained by practice or use of various aspects of the methodologies, instrumentalities, and combinations set forth in the detailed examples discussed below.

BRIEF DESCRIPTION OF THE DRAWINGS

The present disclosure is further described in terms of exemplary embodiments. These exemplary embodiments are described in detail with reference to the drawings. These embodiments are non-limiting exemplary embodiments, in which like reference numerals represent similar structures throughout the several views of the drawings, and wherein.

DETAILED DESCRIPTION

In the following detailed description, numerous specific details are set forth by way of examples in order to provide a thorough understanding of the relevant disclosure. However, it should be apparent to those skilled in the art that the present disclosure may be practiced without such details. In other instances, well-known methods, procedures, systems, components, and/or circuitry have been described at a relatively high-level, without detail, in order to avoid unnecessarily obscuring aspects of the present disclosure. Various modifications to the disclosed embodiments will be readily apparent to those skilled in the art, and the general principles defined herein may be applied to other embodiments and applications without departing from the spirit and scope of the present disclosure. Thus, the present disclosure is not limited to the embodiments shown, but to be accorded the widest scope consistent with the claims.

The terminology used herein is for the purpose of describing particular example embodiments only and is not intended to be limiting. As used herein, the singular forms "a," "an," and "the" may be intended to include the plural forms as well, unless the context clearly indicates otherwise. It will be further understood that the terms "comprise,"

"comprises," and/or "comprising," "include," "includes," and/or "including," when used in this specification, specify the presence of stated features, integers, steps, operations, elements, and/or components, but do not preclude the presence or addition of one or more other features, integers, steps, operations, elements, components, and/or groups thereof.

It will be understood that the term "system," "module," and/or "block" used herein are one method to distinguish different components, elements, parts, sections or assembly of different levels in ascending order. However, the terms may be displaced by another expression if they achieve the same purpose.

Figure 1:
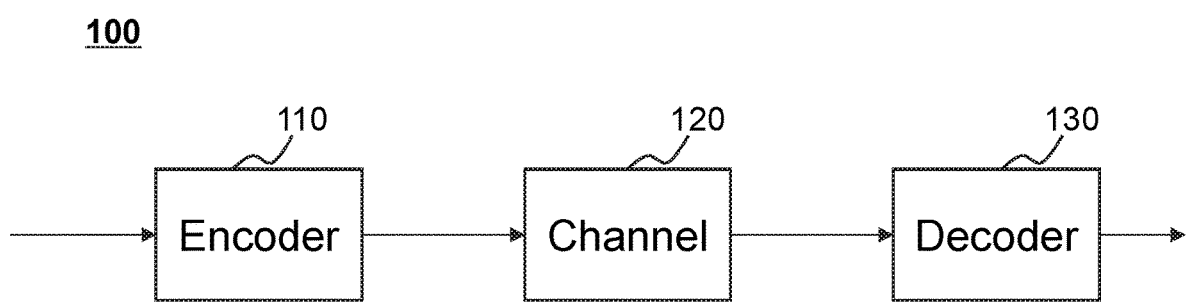
FIG. 1 is a schematic diagram illustrating an exemplary data transmission system according to some embodiments of the present disclosure.

Generally, the word "module," or "block," as used herein, refers to logic embodied in hardware or firmware, or to a collection of software instructions. A module, or a block described herein may be implemented as software and/or hardware and may be stored in any type of non-transitory computer-readable medium or another storage device. In some embodiments, a software module/unit/block may be compiled and linked into an executable program. It will be appreciated that software modules can be callable from other modules/units/blocks or from themselves, and/or may be invoked in response to detected events or interrupts. Software modules/units/blocks configured for execution on computing devices (e.g., the decoder 130 as illustrated in FIG. 1) may be provided on a computer-readable medium, such as a compact disc, a digital video disc, a flash drive, a magnetic disc, or any other tangible medium, or as a digital download (and can be originally stored in a compressed or installable format that needs installation, decompression, or decryption prior to execution). Such software code may be stored, partially or fully, on a storage device of the executing computing device, for execution by the computing device. Software instructions may be embedded in firmware, such as an Electrically Programmable Read-Only-Memory (EPROM). It will be further appreciated that hardware modules/units/blocks may be included in connected logic components, such as gates and flip-flops, and/or can be included of programmable units, such as programmable gate arrays or processors. The modules/units/blocks or computing device functionality described herein may be implemented as software modules/units/blocks, but may be represented in hardware or firmware. In general, the modules/units/blocks described herein refer to logical modules/units/blocks that may be combined with other modules/units/blocks or divided into sub-modules/sub-units/sub-blocks despite their physical organization or storage. The description may be applicable to a system, an engine, or a portion thereof.

It will be understood that when a module or block is referred to as being "connected to," or "coupled to," another module, or block, it may be directly connected or coupled to, or communicate with the other module, or block, or an intervening unit, engine, module, or block may be present, unless the context clearly indicates otherwise. As used herein, the term "and/or" includes any and all combinations of one or more of the associated listed items.

These and other features, and characteristics of the present disclosure, as well as the methods of operation and functions of the related elements of structure and the combination of parts and economies of manufacture, may become more apparent upon consideration of the following description with reference to the accompanying drawings, all of which form a part of this disclosure. It is to be expressly understood, however, that the drawings are for the purpose of illustration and description only and are not intended to limit the scope of the present disclosure. It is understood that the drawings are not to scale.

It should be noted that the decoding method described in the present disclosure is provided in connection with a bit-flipping method for LDPC codes used in an SSD controller. However, it shall not be limiting. Persons of ordinary skill in the art can make modifications or variations under the teaching of the present disclosure and use the decoding method in other decoders or controllers, or decoding other types of code. Such modifications or variations are within the protection scope of the present disclosure.

Provided herein are an improved bit-flipping method for low-density parity-check (LDPC) codes and a system for decoding received LDPC codewords using the improved bit-flipping method. The received LDPC codewords may be decoded with a two-dimensional matrix called a parity check matrix. The parity check matrix may define a plurality of bit nodes and check nodes. The decoding process may include estimating values (also referred to as "hard decisions") with respect to the bits of the received LDPC codeword (or "codeword" for brevity) by the plurality of bit nodes and check nodes. In some embodiments, a flipping energy of a bit node may be obtained based on a function of values of check nodes connected to it. A flipping reliability of the bit node, which represents the reliability of a flipping operation on the bit node, may be determined by comparing the flipping energy with at least one flipping energy threshold. Then, a flipping probability of the bit node may be determined based on the flipping reliability and a flipping rule. A flipping test may be performed according to the flipping probability, and as a result, at least one target bit node that is required to be flipped may be determined and further flipped. After flipping, hard decisions of the bit nodes may be accordingly updated and a syndrome weight associated with the updated hard decisions may be checked. The process of updating hard decisions may be iteratively preformed until the syndrome weight associated with a specific updated hard decision vector is zero or a preset number of iterations is reached. For brevity, "bit", "bit node", "variable node" may be used interchangeably in the present disclosure to refer to a binary digit in the codeword or a variable node corresponding to the binary digit defined by the parity check matrix.

A conventional bit-flipping method usually decides whether to flip a bit node simply based on the flipping energy. For example, if the flipping energy is greater than a threshold, the hard decision of the bit node is flipped; otherwise, the hard decision of the bit node is not flipped. Because of this, the randomness of the conventional bit-flipping method is low and the number of iterations of updating the hard decisions before it converges is large. In other words, the convergence speed is low. In contrast, the improved bit-flipping method disclosed in the present disclosure introduces the use of the flipping test based on a flipping probability of the bit node. In a broad view of all the bit nodes, the flipping probabilities are positively related to the flipping energies, which is consistent with the conventional bit-flipping method. In a specific view of each individual bit node, the flipping probabilities provide the bit nodes with certain degrees of randomness, e.g., a bit node with 10% flipping probability may still have a chance to be flipped. Such design provides a randomness while maintaining an overall accuracy, resulting in a higher error correction capability and a faster convergence speed. The higher error correction capability and the faster convergence speed reduce the computing load in subsequent decoding (e.g., using a min-sum decoder) and increase the overall speed of the LDPC decoder.

FIG. 1 is a schematic diagram illustrating an exemplary data transmission system according to some embodiments of the present disclosure. As shown in FIG. 1, the data transmission system 100 may include an encoder 110, a channel 120, and a decoder 130 (also referred to as a decoding system). The encoder 110 may be installed on a transmitter and the decoder 130 may be installed on a receiver. The encoder 110 may encode input data to generate a codeword using an encoding method. The encoding method may include a symmetric encryption method and/or an asymmetric encryption method. The symmetric encryption method may include but not limited to LDPC encoding. The encoded codeword may be transmitted to a decoder 130 through a channel 120. The channel 120 may include but not limited to a satellite communication channel using satellite dishes, a wireless communication channel using base stations and/or local antennae, a wired communication channel, a fiber-optic communication channel using electrical to optical (E/O) interface, etc. The encoded codeword may be decoded by the decoder 130 such that the input data may be recovered. In some embodiments, the encoder 110 and the decoder 130 may correspond to a similar type of code. For example, the encoder 110 and the decoder 130 may both correspond to the LDPC code. In some embodiments, the encoder 110, the channel 120, and/or the decoder 130 may be parts of a solid state drive (SSD) controller, but this shall not be limiting.

Figure 2:
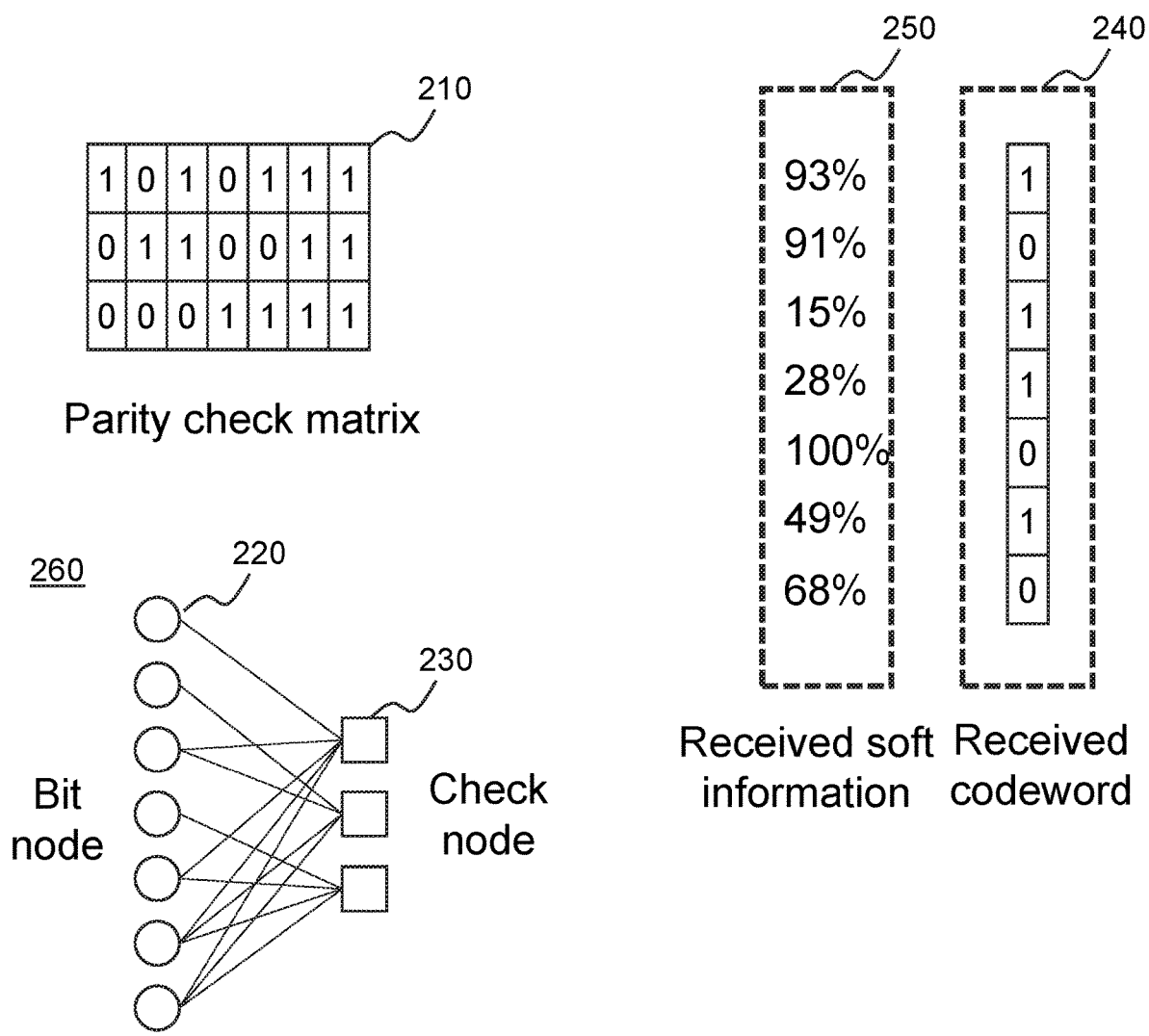
FIG. 2 is a schematic diagram illustrating a received codeword and a parity check matrix according to some embodiments of the present disclosure.

FIG. 2 is a schematic diagram illustrating a received codeword and a parity check matrix according to some embodiments of the present disclosure. As shown in FIG. 2, a received codeword 240 may include a plurality of bits, e.g., seven bits. In some embodiments, the plurality of bits may each include a binary value, e.g., "0" or "1". Alternatively, the plurality of bits may include decimal values, octal values, hexadecimal values, etc. In some embodiments, the values of the plurality of bits may be referred to as hard information (or "hard decisions"). Soft information 250 may be received together with the hard information 240. The received soft information 250 may be provided by the channel (e.g., the channel 120). In some embodiments, the received soft information 250 may be related to the reliability of the hard information. For example, the received soft information 250 may include an initial reliability in terms of percentages for each of the plurality of bits. A higher percentage may indicate that the bit is more reliable, and vice versa. For example, an 100% initial reliability may indicate that the bit is completely reliable and a 0% initial reliability may indicate that the bit is completely unreliable. The received soft information 250 may be represented by binary number, decimal number, octal number or hexadecimal number, etc. In some embodiments, a parity check matrix 210 may be prestored in the decoder, or may be received before, after or at the same time when the codeword 240 and the received soft information 250 are received. The parity check matrix 210 may be received through a same or different channel as the codeword 240. The parity check matrix 210 may include a plurality of rows and a plurality of columns. Each column of the parity check matrix 210 may correspond to a bit node 220, and each row of the parity check matrix 210 may correspond to a check node 230. The count of the columns may be equal to the count of the bits in the received codeword 240 (e.g., seven). In some embodiments, the parity check matrix 210 may be a regular LDPC check matrix, e.g., the summation of values in each row is a fixed value and the summation of values in each column is also a fixed value. Alternatively, the parity check matrix 210 may be an irregular LDPC check matrix, e.g., the summation of values in each row is not a fixed value or the summation of values in each column is not a fixed value. In some embodiments, the relationship between the bit nodes 220 and the check nodes 230 defined by the parity check matrix 210 may be illustrated in a bipartite graph 260 (also referred to as a Tanner graph). As shown in the bipartite graph 260, the three squares may represent three check nodes 230 corresponding to three rows of the parity check matrix 210. The seven circles may represent seven bit nodes 220 corresponding to the seven columns of the parity check matrix 210, respectively. A connection between a check node 230 and a bit node 220 may correspond to a "1" in a corresponding location of the parity check matrix 210. For example, the "1" in the third row and the fifth column of the parity check matrix 210 may be shown in the bipartite graph 260 as a connection between the fifth bit node 220 and the third check node 230.

In some embodiments, a syndrome weight may be calculated to evaluate whether the received codeword 240 is the same as a target codeword that is generated in the encoder 110 by encoding the input data. If the syndrome weight is zero, the received codeword 240 is considered to be the same as the target codeword; otherwise, the received codeword 240 is considered to be different from the target codeword. In a case that the received codeword 240 is not the same as the target codeword. An iterative decoding process may be performed by iteratively updating the values (i.e., the hard decisions) of the bit nodes 220 until the syndrome weight becomes zero or a maximum count of iterations is reached.

Generally, the process of decoding the received codeword may be illustrated with reference to the Tanner graph. For example, the codeword may include seven bits, corresponding to the seven bit nodes 220. Initially, each bit node 220 may be assigned an initial value with respect to a corresponding bit of the codeword 240 (e.g., the values in the received codeword). Each bit node 220 may send the corresponding initial value to check nodes 230 connected to it. Then, each bit node 220 may be evaluated according to the values of the check nodes connected to it. According to the evaluation result, one or more bit nodes 220 may be flipped to update their values. In the next iteration, each bit node 220 may be further evaluated based on these updated values. The decoder may continuously perform the iterations until the syndrome weight indicates that the most recent updated bit nodes coincide with the target codeword or a preset number of iterations is met. More descriptions regarding the iterative decoding process may be found elsewhere in the present disclosure, e.g., FIG. 4 and descriptions thereof.

Figure 3:
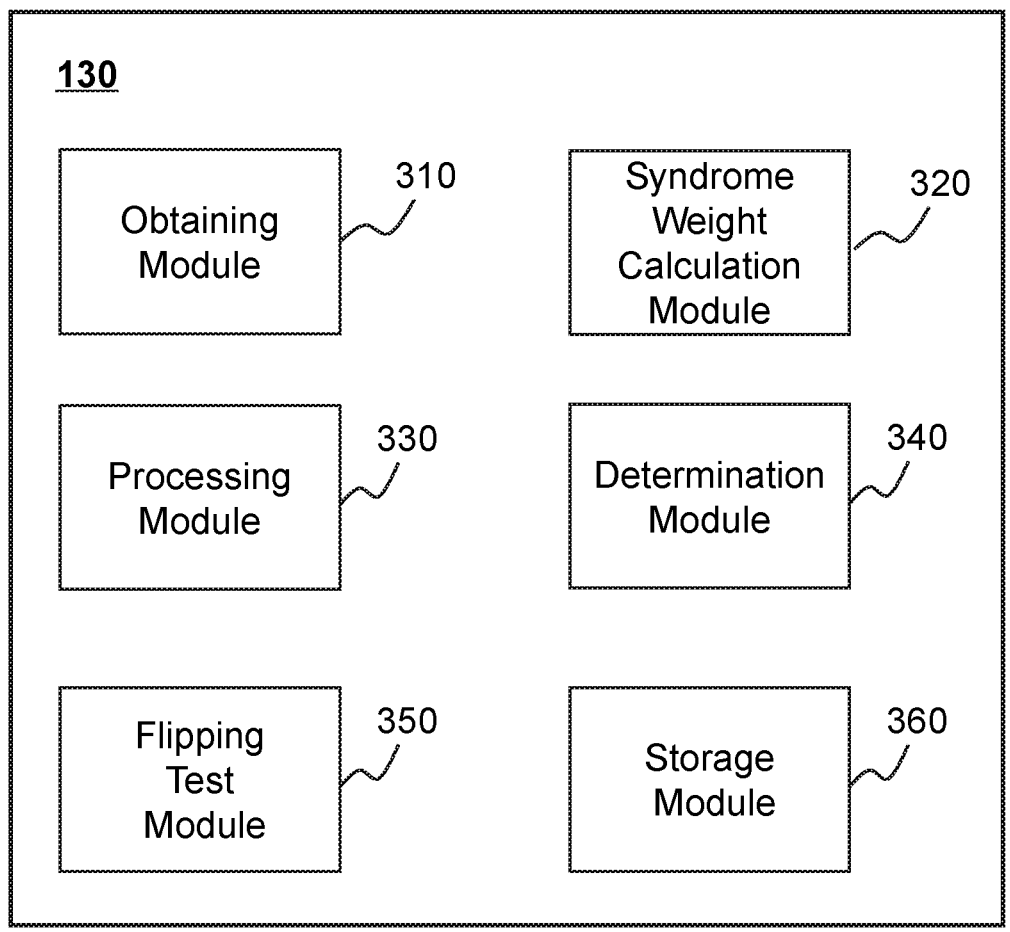
FIG. 3 is a block diagram illustrating an exemplary decoder according to some embodiments of the present disclosure.

FIG. 3 is a block diagram illustrating an exemplary decoder according to some embodiments of the present disclosure. The decoder 130 may include an obtaining module 310, a syndrome weight calculation module 320, a processing module 330, a determination module 340, a flipping test module 350, and a storage module 360.

The obtaining module 310 may be configured to obtain data or information from other modules or units inside or outside the decoder 130. For example, the obtaining module 310 may receive a noisy codeword through a channel. In addition, the obtaining module 310 may obtain one or more parameters that may be used in a decoding process, e.g., a flipping energy threshold for a specific bit node, a parity check matrix for decoding the received codeword. Optionally, the obtaining module 310 may update the one or more parameters during the decoding process.

The syndrome weight calculation module 320 may be configured to check a syndrome weight of, for example, the noisy codeword received from the channel, the updated values (hard decisions) of the codeword, etc., according to a parity check matrix.

The processing module 330 may be configured to determine one or more parameters in the decoding process. For example, the processing module 330 may determine flipping energies of a group of bit nodes. Further, the processing module 330 may determine flipping reliabilities of the group of bit nodes based on the flipping energies. Additionally, the processing module 330 may determine flipping probabilities of the group of bit nodes based on the flipping reliabilities. In some embodiments, the processing module 330 may flip one or more bit nodes to update the corresponding values or hard decisions. In some embodiments, the processing module 330 may compare a syndrome weight determined by the syndrome weight calculation module 320 with a specific value (e.g., zero) to judge whether the received codeword has being properly decoded.

The determination module 340 may be configured to determine whether a preset condition is satisfied during the decoding process. For example, the determination module 340 may determine whether the decoding process should be terminated according to the preset condition. Exemplary preset condition may include the syndrome weight being equal to zero, the number of iterations reaching a threshold, the syndrome weight not reducing in a preset amount of successive iterations, etc.

The flipping test module 350 may be configured to perform a flipping test on bit nodes to determine at least one target bit node that is required to be flipped. In the flipping test, each bit node may be determined whether to be flipped according to its corresponding flipping probability. For example, a bit node with a 70% flipping probability may have a 70% chance to be flipped and a 30% (i.e., 1-70%) chance not to be flipped in the flipping test.

The storage module 360 may be configured to store instructions that can be executed by at least one processor to perform one or more operations as described elsewhere in the present disclosure.

The modules in the decoder 130 may be connected to or communicate with each other via a wired connection or a wireless connection. The wired connection may include a metal cable, an optical cable, a hybrid cable, or the like, or any combination thereof. The wireless connection may include a Local Area Network (LAN), a Wide Area Network (WAN), a Bluetooth, a ZigBee, a Near Field Communication (NFC), or the like, or any combination thereof. Two or more of the modules may be combined as a single module, and any one of the modules may be divided into two or more units.

It should be noted that the above description is merely provided for the purposes of illustration, and not intended to limit the scope of the present disclosure. For persons having ordinary skills in the art, multiple variations and modifications may be made under the teachings of the present disclosure. However, those variations and modifications do not depart from the scope of the present disclosure.

Figure 4:
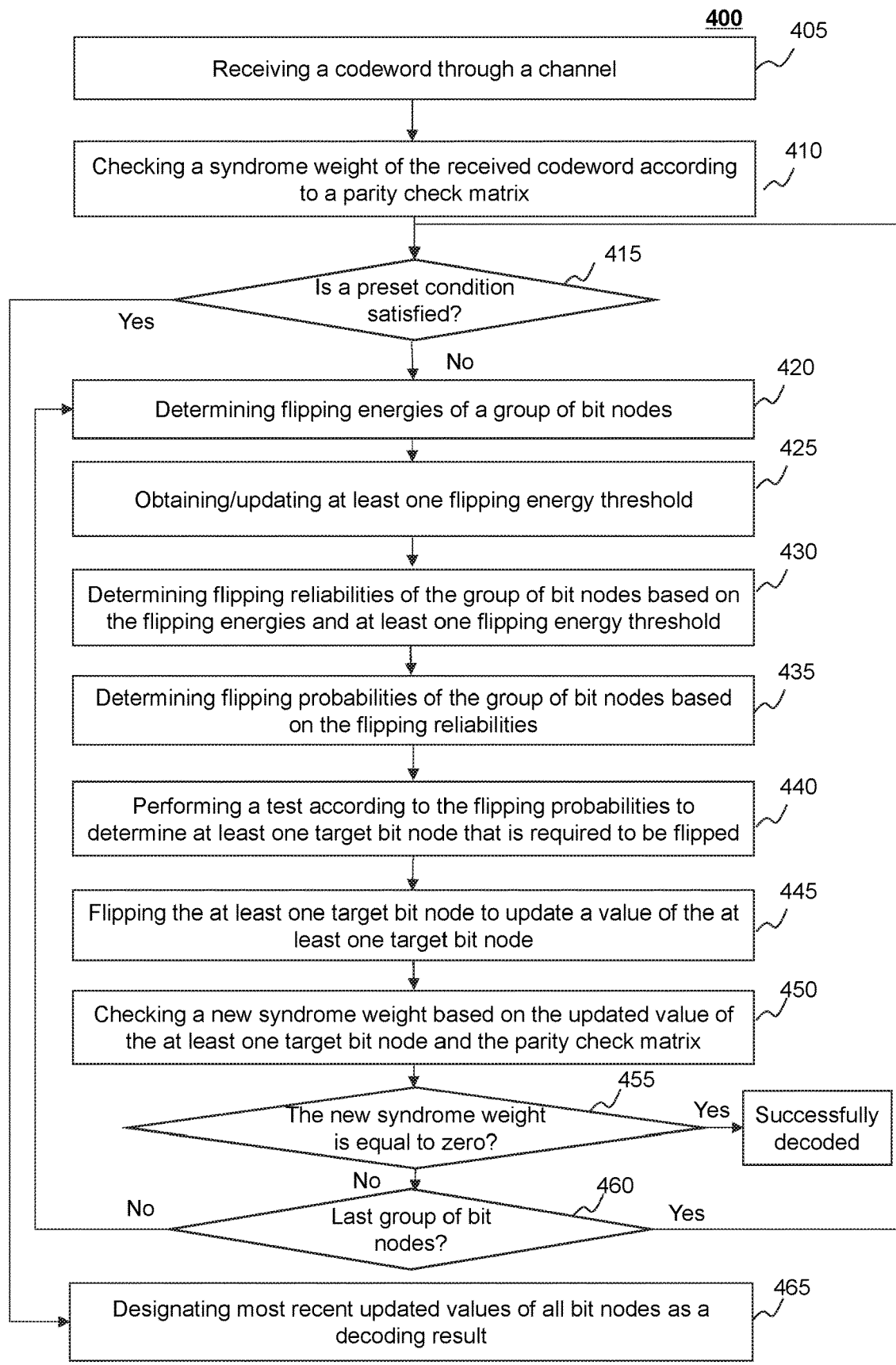
FIG. 4 is a flowchart illustrating an exemplary process for decoding a codeword according to some embodiments of the present disclosure.

FIG. 4 is a flowchart illustrating an exemplary process for decoding a received codeword according to some embodiments of the present disclosure. In some embodiments, at least part of process 400 may be performed by the decoder 130. For example, the process 400 may be stored in a storage device (e.g., an external storage device, the storage module 360) in the form of instructions (e.g., an application), and invoked and/or executed by the decoder 130 (e.g., the processing module 330 illustrated in FIG. 3). The operations of the illustrated process presented below are intended to be illustrative. In some embodiments, the process 400 may be accomplished with one or more additional operations not described, and/or without one or more of the operations discussed. Additionally, the order in which the operations of the process 400 as illustrated in FIG. 4 and described below is not intended to be limiting. An exemplary diagram illustrating the process 400 may be found in FIG. 7.

In 405, the decoder 130 (e.g., the obtaining module 310) may receive a noisy codeword through a channel. For example, the encoded LDPC codeword is transmitted thought the channel 120 which might introduce noise into the encoded LDPC codeword. Then the decoder 130 may receive the noisy LDPC codeword.

The channel may provide hard information and/or soft information of the received noisy codeword to the decoder 130. The hard information may refer to values of the bits of the codeword and the soft information may refer to an initial reliability of the values of the bits. In some embodiments, the soft information may be provided by the channel 120. Examples of the received codeword may be found elsewhere in the present disclosure, e.g., the codeword 240, the codeword 710, the codeword 810, the codeword 910, etc.

In 410, the decoder 130 (e.g., the syndrome weight calculation module 320) may check a syndrome weight of the received codeword according to a parity check matrix. The parity check matrix may define relationships between a plurality of bit nodes and a plurality of check nodes. Examples of the parity check matrix may be found elsewhere in the present disclosure, e.g., the parity check matrix 210. In some embodiments, the syndrome weight may be determined based on the product of the parity check matrix and the received codeword. For example, a syndrome vector may be calculated as:

$$S = H * r; \qquad (1)$$

where S denotes the syndrome vector, H denotes the parity check matrix, and r denotes the received codeword. In some embodiments, the decoder 130 may further determine the syndrome weight of the codeword based on the syndrome vector. For example, the syndrome weight of the codeword may be denoted as a summation of non-zero values in the syndrome vector, or the count of non-zero values in the syndrome vector.

In 415, the decoder 130 (e.g., the determination module 340) may determine whether a preset condition is satisfied. The preset condition may include conditions under which the decoding process should be terminated. For example, the preset condition may include the syndrome weight being equal to zero, the number of iterations reaching a threshold, the syndrome weight not reducing in a preset amount of successive iterations, etc. In response to determining that the preset condition is satisfied, the process 400 may proceed to operation 465; otherwise, the process 400 may proceed to operation 420.

In 420, the decoder 130 (e.g., the processing module 330) may determine flipping energies of a group of bit nodes. In some embodiments, each bit node in the group may correspond to one of the flipping energies. The flipping energy of each bit node may be determined based on a function of values of the check nodes connected to the bit node. In a general expression, flipping energy $E(v_k, i)$ of a bit node $v_k$ at the i-th iteration may be a function (e.g., summation) of values of check nodes connected to $v_k$ at the i-th iteration. As used herein, the function of values of check nodes may be any suitable arithmetical operation on those values. Merely by way of example, assuming that there are g check nodes connected with $v_k$ and their values at the i-th iteration are $CN_{k1}(i), CN_{k2}(i), \ldots,$ and $CN_{kg}(i)$, respectively, the flipping energy may be calculated as:

$$E(v_k,i)=CN_{k1}(i)+CN_{k2}(i)+\ldots+CN_{kg}(i); \qquad (2)$$

Since values of the check nodes are binary for LDPC codes (e.g., CN(i) is either 0 or 1), the value of the flipping energy $E(v_k,i)$ satisfies the condition: $0<=E(v_k,i)<=g$. For example, if a bit node is connected to three check nodes, the flipping energy of the bit node may be calculated as a summation of values of the three check nodes. If two of the three check nodes are 1 and the other one is 0, the flipping energy of the bit node may be 2.

In some embodiments, the group of bit nodes may include one or more bit nodes among all the bit nodes defined by the parity check matrix. For example, the group of bit nodes may only include a single bit node, which means that the decoder 130 may only process one bit node at a time. As another example, the group of bit nodes may include two or more bit nodes, which means that the decoder 130 may process multiple bit nodes at a time (e.g., in a parallel processing manner). In some embodiments, all the bit nodes defined by the parity check matrix may be classified into one or more groups according to the indexes of the bit nodes. For example, a preset number of bit nodes with successive index may be classified into a same group. Merely by way of example, the preset number may be three, e.g., the $1^{st}$, $2^{nd}$ and $3^{rd}$ bit nodes are classified into a $1^{st}$ group, the $4^{th}$, $5^{th}$, and $6^{th}$ bit nodes are classified into a $2^{nd}$ group, and so on. The preset number can be any suitable integer, such as 1, 2, 3, 5, 10, 20, 30, etc. In some embodiments, the preset number may be an integer between one and the count of all the bit nodes.

In some embodiments, the bit nodes may be classified according to initial reliabilities of bits (also referred to as soft information) corresponding to the bit nodes. For example, bit nodes whose corresponding bits have high (e.g., greater than 80%) initial reliabilities may be classified into a first group. Bit nodes whose corresponding bits have low (e.g., less than 40%) initial reliabilities may be classified into a second group. Bit nodes whose corresponding bits have medium (e.g., between 40% and 80%) initial reliabilities may be classified into a third group. In some embodiments, the classification of bit nodes may be performed in each iteration, e.g., all the bit nodes are re-classified in each iteration. Optionally, the classification of bit nodes may vary in different iterations of the decoding process. As used herein, in one iteration of the decoding process, all bit nodes may be processed by the decoder according to the process from the operation 420 to the operation 415. Alternatively, the classification of bit nodes may be performed only once during the whole decoding process, e.g., the bit nodes are classified into groups only at the beginning of the first iteration.

In 425, the decoder 130 (e.g., the obtaining module 310, the processing module 330) may obtain or update at least one flipping energy threshold. In the first iteration, the obtaining module 310 may obtain at least one flipping energy threshold. In subsequent iterations, the processing module 330 may update the at least one flipping energy threshold.

In some embodiments, each bit node in the group of bit nodes may correspond to multiple flipping energy thresholds. For illustration purposes, in a general expression, there may be L different flipping energy thresholds for a specific bit node, expressed as $T\_F_0$, $T\_F_1$, $T\_F_2$, ..., $TF_{L-1}$, respectively. $T\_F_0$ may be the smallest, $T\_F_1$ may be greater than $T\_F_0$, $T\_F_2$ may be greater than $T\_F_0$ and T as so on, and $TF_{L-1}$ may be the largest. In some embodiments, $T\_F_0$ may be greater than or equal to 0, and $TF_{L-1}$ may be smaller than the highest flipping energy, which is equal to the total number of check nodes connected to the specific bit node. For example, the total number of check nodes connected to the specific bit node may be three, and the at least one flipping energy threshold may include a first flipping energy threshold $T\_F_0$ of 0 and a second flipping energy threshold $T\_F_1$ of 2.

In some embodiments, the at least one flipping energy threshold (e.g., the flipping energy threshold(s) of each bit node) may be updated based on the index of the bit node, the channel mismatch information between the current hard decision and the channel input dard decision, the number of check nodes connected to the bit node, the iteration number, the number of flipping operations of previous iterations, the syndrome weight in the current iteration, the syndrome weight at a previous time point, etc. In some embodiments, the flipping energy thresholds corresponding to different bit nodes may be same or different. For example, if two bit nodes are each connected to different numbers of check nodes, the flipping energy thresholds of the two bit nodes may be different. Specifically, the bit node connected to more check nodes may be assigned with a larger flipping energy threshold. In some embodiments, the flipping energy threshold(s) corresponding to a same bit node may be same or different. For example, for a same bit node, a smaller flipping energy threshold may be assigned in a later iteration than in a previous iteration. In some embodiments, a bit node may be assigned with a first flipping energy threshold if a channel mismatch happens (e.g., a current hard decision of the bit node is different from its channel input hard decision), and may be assigned with a second flipping energy threshold (different from the first flipping energy threshold) if the channel mismatch does not happen.

In 430, the decoder 130 (e.g., the processing module 330) may determine flipping reliabilities of the group of bit nodes based on the flipping energies and the at least one flipping energy threshold. In some embodiments, the decoder 130 may determine the flipping reliability of each bit node in the group by comparing the flipping energy of the bit node with the flipping energy threshold(s) corresponding to the bit node. For example, in the i-th iteration, if the flipping energy $E(v_k,i)$ of a bit node $v_k$ is greater than or equal to $T\_F_{L-1}$, the flipping reliability $FR(v_k, i)$ of the bit node $v_k$ may be determined as grade "L−1". As another example, if the flipping energy $E(v_k,i)$ of the bit node $v_k$ is less than $T\_F_{L-1}$ but greater than or equal to $T\_F_{L-2}$, the flipping reliability $FR(v_k, i)$ of the bit node $v_k$ may be determined as grade "L−2". As a further example, if the flipping energy $E(v_k,i)$ of the bit node $v_k$ is greater than or equal to $T\_F_0$ but less than $T\_F_1$, the flipping reliability $FR(v_k, i)$ of the bit node $v_k$ may be determined as grade "0". It should be noted that the grades "0", "L−2", "L−1", etc. of the flipping reliability may correspond to different degrees of reliability of the bit node. For example, grade "L−1" may indicate that the value of the bit node is "extremely unreliable", and grade "0" may indicate that the value of the bit node is "extremely reliable".

In 435, the decoder 130 (e.g., the processing module 330) may determine flipping probabilities of the group of bit nodes based on the flipping reliabilities. In some embodiments, the decoder 130 may determine the flipping probability of each bit node based on the flipping reliability of the bit node and a flipping rule, e.g., a relationship between the flipping reliability and the flipping probability. For example, the flipping rule may include a mapping between flipping reliability of grades "0", "1", . . . , "L-2", "L-1" and flipping probability of "$p_0$", "$p_1$", . . . , "$p_{L-2}$", "$p_{L-1}$", respectively, wherein $1 >= p_{L-1} >= p_{L-2} >= \ldots >= p_1 >= p_0 >= 0$. Merely by way of example, the flipping rule may include a mapping between flipping reliability of grade "3", grade "2", grade "1", and grade "0" and the corresponding flipping probability of 90%, 70%, 50%, and 10%, respectively.

In 440, the decoder 130 (e.g., the flipping test module 350) may perform a test according to the flipping probabilities to determine at least one target bit node that is required to be flipped. In the flipping tests, each bit node in the group may be determined whether to be flipped according to its corresponding flipping probability. For example, a bit node with a 70% flipping probability may have a 70% chance to be flipped and a 30% (i.e., 1-70%) chance not to be flipped in the flipping test. For illustration purposes, for the bit node with a 70% flipping probability, a random value between 0 to 1 may be generated. If the generated random value is within the range of 0 to 0.7 (which corresponds to the 70% flipping probability), the bit node may be required to be flipped. If the generated random value is within the range of 0.7 to 1 (which corresponds to the 30% non-flipping probability), the bit node may not be flipped. After the flipping tests, the bit node(s) that is required to be flipped may be determined as the target bit node(s).

In 445, the decoder 130 (e.g., the processing module 330) may flip the at least one target bit node to update a value of the at least one target bit node. As used herein, "flipping" a bit node may refer to changing the value of the bit node from "0" to "1" or from "1" to "0". More descriptions of flipping the bit node(s) may be found elsewhere in the present disclosure, e.g., FIGS. 6-8 and descriptions thereof.

In 450, the decoder 130 (e.g., the syndrome weight calculation module 320) may check a new syndrome weight based on the updated value of the at least one target bit node and the parity check matrix. For example, the syndrome weight may be determined based on the product of the parity check matrix and the updated values of the plurality of bit nodes (including the updated values of the at least one target bit node and the values of other bit nodes not updated). The operation 450 may be similar to the operation 410 and is not repeated herein.

In 455, the decoder 130 (e.g., the processing module 330) may determine whether the new syndrome weight is equal to zero. If the new syndrome weight is equal to zero, the decoder 130 may determine that the updated values of the plurality of bit nodes coincide with the target codeword encoded by, for example, the encoder 110, which means that the received codeword is successfully decoded. If the new syndrome weight is not equal to zero, the process 400 may proceed to 460.

In 460, the decoder 130 (e.g., the processing module 330) may determine whether the currently processed bit node(s) belongs to the last group of bit nodes. In response to determining that the currently processed bit node(s) belongs to the last group of bit nodes, i.e., all the bit nodes have been processed in the current iteration, the process 400 may proceed back to the operation 415, in which the decoder may further determine whether a new iteration needs to be performed. In response to determining that one or more other groups of bit nodes have not been processed in the current iteration, the process 400 may proceed to the operation 420, in which the decoder may further retrieve another group of bit nodes to determine their flipping energies.

In 465, the decoder 130 (e.g., the processing module 330) may designate the most recent updated values of all bit nodes as a decoding result. In some embodiments, if the preset condition in the operation 415 is the syndrome weight being equal to zero, the decoding result in the operation 465 may be deemed as a success of decoding. If the preset condition in the operation 415 is the number of iterations reaching a threshold, the decoding result in 465 may be deemed as a success of decoding (in the case when the syndrome weight is also equal to zero), or as a failure of decoding (in the case when the syndrome weight is not yet equal to zero).

For persons having ordinary skills in the art, multiple variations and modifications may be made under the teachings of the present disclosure. However, those variations and modifications do not depart from the scope of the present disclosure. For example, the operation 425 may be performed before the operation 420. In such cases, in each iteration, the decoder 130 may use a same set of flipping energy thresholds to determine the flipping operations of different groups of bit nodes.

Figure 5:
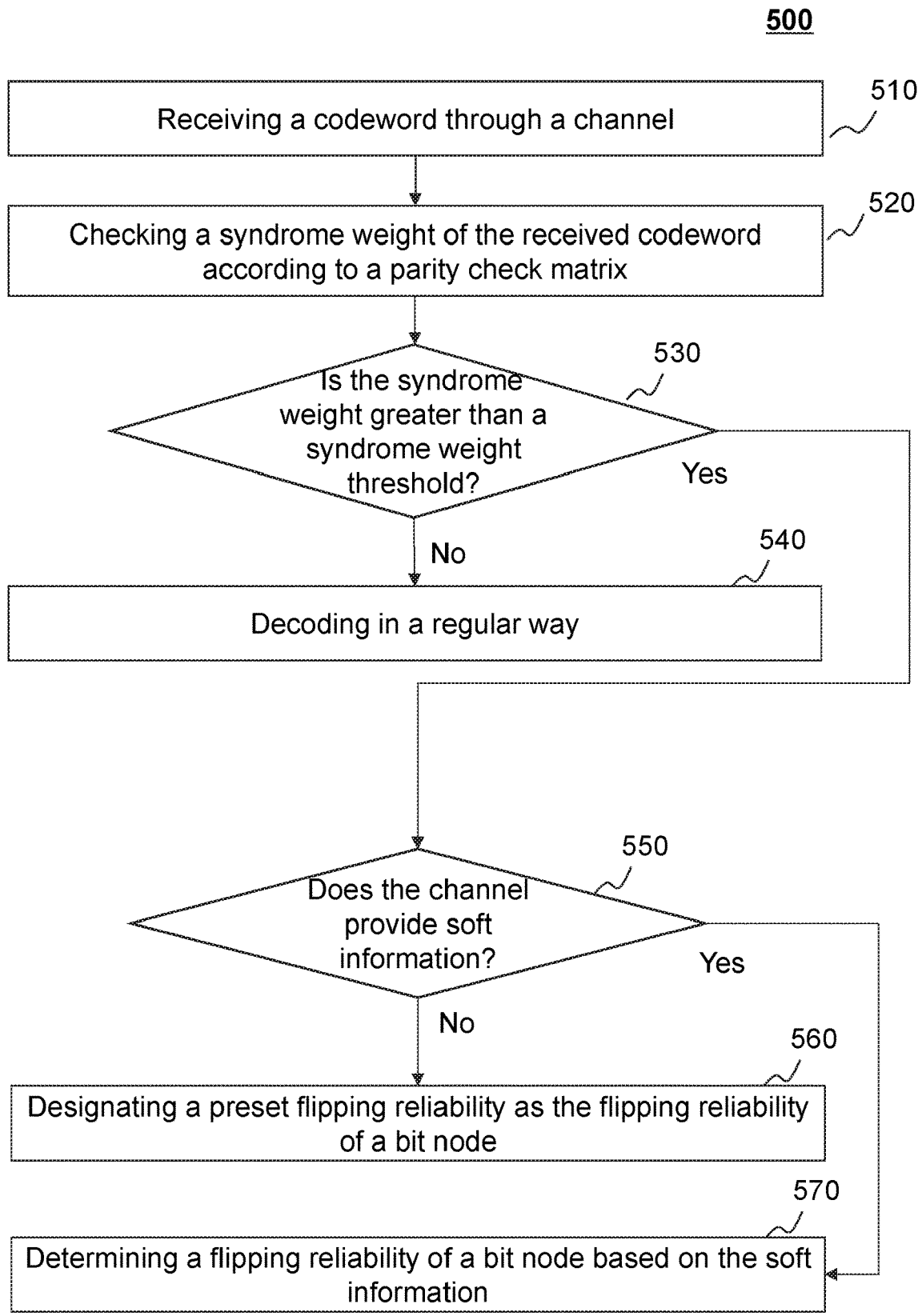
FIG. 5 is a flowchart illustrating an exemplary process for decoding a codeword according to some embodiments of the present disclosure.

FIG. 5 is a flowchart illustrating an exemplary process for decoding a codeword according to some embodiments of the present disclosure. In some embodiments, at least part of process 500 may be performed by the decoder 130. For example, the process 500 may be stored in a storage device (e.g., an external storage device, the storage module 360) in the form of instructions (e.g., an application), and invoked and/or executed by the decoder 130 (e.g., the processing module 330 illustrated in FIG. 3). The operations of the illustrated process presented below are intended to be illustrative. In some embodiments, the process 500 may be accomplished with one or more additional operations not described, and/or without one or more of the operations discussed. Additionally, the order in which the operations of the process 500 illustrated in FIG. 5 and described below is not intended to be limiting. Exemplary diagrams illustrating operation 560 and operation 570 may be found in FIG. 7 and FIG. 8, respectively.

In 510, the decoder 130 (e.g., the obtaining module 310) may receive a codeword through a channel. The operation 510 may be similar to the operation 405 and is not repeated herein.

In 520, the decoder 130 (e.g., the syndrome weight calculation module 320) may check a syndrome weight of the received codeword according to a parity check matrix. The operation 520 may be similar to the operation 410 and is not repeated herein.

In 530, the decoder 130 (e.g., the determination module 340) may determine whether the syndrome weight is greater than a syndrome weight threshold. In some embodiments, the syndrome weight threshold may be set according to the size of the parity check matrix. For example, a larger size of the parity check matrix may correspond to a greater syndrome weight threshold. If the syndrome weight exceeds the syndrome weight threshold, the values of bit nodes (also referred to as hard information) may be considered to be "extremely unreliable". In some embodiments, the syndrome weight threshold may be any suitable value, including but not limited to 50, 100, 200, 400, 500, 600, 1000, etc. In response to determining that the syndrome weight is greater than the syndrome weight threshold, the process 500 may proceed to operation 550; otherwise, the process 500 may proceed to operation 540.

In 540, the decoder 130 may decode the received codeword in a regular way. For example, the regular way of decoding the received codeword may include part or all of the operations 415 to 465.

In 550, the decoder 130 may receive soft information from the channel 120. The soft information may be referred to as initial reliabilities of the hard information (e.g., values of the bit nodes). In response to the case when the channel provides soft information, the process 500 may proceed to operation 570; otherwise, the process 500 may proceed to operation 560.

In 560, the decoder 130 (e.g., the processing module 330) may designate a preset flipping reliability as the flipping reliability of a bit node. In some embodiments, each bit node (e.g., in a group of bit nodes) may be designated a same flipping reliability. Alternatively, each bit node may be designated an individual flipping reliability that may be same as or different from each other. In some embodiments, as the hard information is extremely unreliable (e.g., the syndrome weight being greater than the syndrome weight threshold in 530), the preset flipping reliability of each bit node may be a maximum value or a relatively high value, indicating that each bit node may have a relatively high probability of being flipped in subsequent operations. Merely by way of example, the decoder 130 may designate grade "L−1" as the flipping reliability of each bit node.

Figure 10:
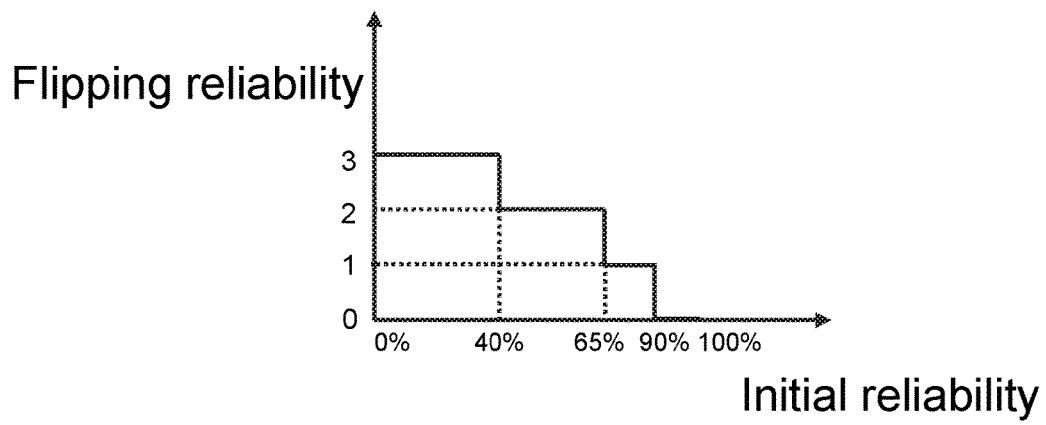
FIG. 10 is a schematic diagram illustrating an exemplary relationship between an initial reliability and a flipping reliability according to some embodiments of the present disclosure.

In 570, the decoder 130 (e.g., the processing module 330) may determine a flipping reliability of a bit node based on the soft information. In some embodiments, a relationship between the initial reliability and the flipping reliability may be obtained. The relationship may be represented by a linear function, a non-linear function, a continuous function, or a discrete function, or the like. The flipping reliability of the bit node may be determined based on the soft information and the relationship between the initial reliability and the flipping reliability. For illustration purposes, FIG. 10 provides an exemplary relationship between the initial reliability and the flipping reliability. As exemplified in FIG. 10, if the initial reliability is between 0% and 40%, the flipping reliability may be determined as grade "3". If the initial reliability is between 40% and 65%, the flipping reliability may be determined as grade "2". If the initial reliability is between 65% and 90%, the flipping reliability may be determined as grade "1". If the initial reliability is between 90% and 100%, the flipping reliability may be determined as grade "0".

In some embodiments, after determining the flipping reliabilities of one or more bit nodes in the operation 560 or 570, the process 500 may proceed to operation 435.

For persons having ordinary skills in the art, multiple variations and modifications may be made under the teachings of the present disclosure. However, those variations and modifications do not depart from the scope of the present disclosure. In some embodiments, the operation 530 may be omitted and regardless of whether the syndrome weight is greater than the syndrome weight threshold or not, and the received codeword may be decoded based on the hard information only or both the hard information and the soft information.

Figure 6:
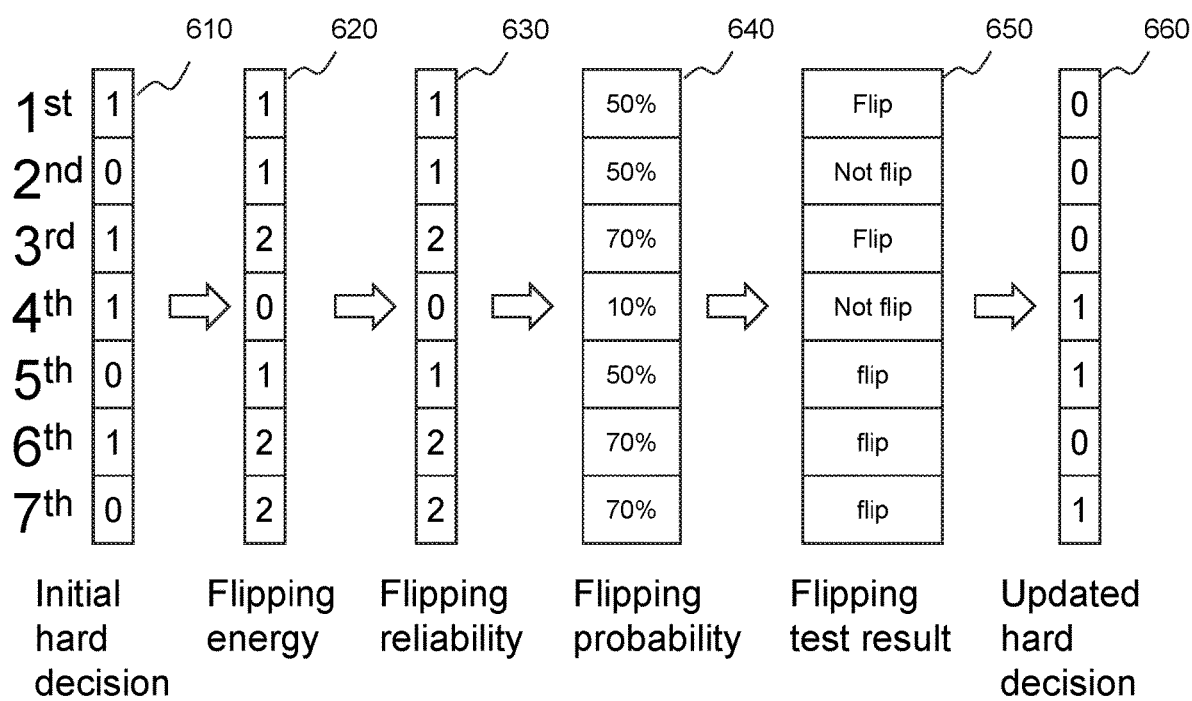
FIG. 6 is a schematic diagram illustrating an exemplary process for decoding a codeword according to some embodiments of the present disclosure.

FIG. 6 is a schematic diagram illustrating an exemplary process for decoding a received codeword according to some embodiments of the present disclosure. As shown in FIG. 6, the initial received codeword 610 may be "1011010", i.e., the initial received codeword 610 includes seven bits having values (i.e., initial hard decisions) of "1", "0", "1", "1", "0", "1", and "0", respectively. In some embodiments, the initial received codeword 610 may be the received codeword 240. In some embodiments, the flipping energy 620 for each bit node may be determined based on a parity check matrix (e.g., the parity check matrix 210 which defines seven bit nodes and three check nodes). As exemplified in parity check matrix 210 in FIG. 2, the first bit node may be connected to the first check node only (not connected to the second check node and the third check node), and the flipping energy of the first bit node may be equal to the value of the first check node. The third bit node may be connected to the first check node and the second check node, and the flipping energy of the third bit node may be a summation of values of the first check node and the second check node. Merely for illustration purposes, assuming that the three check nodes have the values of "1", "1", "0", respectively, the flipping energy of the first bit node is "1", and the flipping energy of the third bit node is "2". Similarly, the flipping energy of the second, fourth, fifth, sixth, and seventh bit node may be calculated as "1", "0", "1", "2", "2", respectively.

In some embodiments, the flipping reliabilities 630 of the seven bit nodes may be determined based on the flipping energies 620 and at least one flipping energy threshold. For example, the at least one flipping energy threshold may include a first flipping energy threshold of 0, a second flipping energy threshold of 1, and a third flipping energy threshold of 2. Merely by way of example, if the flipping energy of a bit node is greater than the third flipping energy threshold (i.e., 2), the flipping reliability of the bit node may be determined as "2". If the flipping energy of a bit node (e.g., the first bit node) is greater than or equal to the second flipping energy threshold (i.e., 1) but less than the third flipping energy threshold (i.e., 2), the flipping reliability of the bit node may be determined as "1". If the flipping energy of a bit node (e.g., the fourth bit node) is greater than or equal to the first flipping energy threshold (i.e., 0) but less than the second flipping energy threshold (i.e., 1), the flipping reliability of the bit node may be determined as "0". Therefore, the flipping reliabilities 630 of the seven bit nodes may be "1", "1", "2", "0", "1", "2", and "2". It should be noted that the "0", "1", or "2" of the flipping reliability is merely used to represent a specific grade of the flipping reliability. Merely by way of example, grade "0" may indicate that the corresponding bit node is very reliable, and grade "2" may indicate that the corresponding bit node is very unreliable.

In some embodiments, the flipping probabilities 640 of the seven bit nodes may be determined based on the flipping reliabilities 630 and a flipping rule, e.g., a relationship between the flipping reliability and the flipping probability. For example, the flipping rule may include a mapping between the flipping reliability of grade "0" and the flipping probability of 10%, a mapping between the flipping reliability of grade "1" and the flipping probability of 50%, and a mapping between the flipping reliability of grade "2" and the flipping probability of 70%. In such cases, the flipping probabilities 640 of the bit nodes may be determined as 50%, 50%, 70%, 10%, 50%, 70%, and 50%, respectively.

Then, flipping tests may be performed on the bit nodes according to their flipping probabilities. In the flipping tests, each bit node is determined whether to be flipped according to its corresponding flipping probability. For example, a bit node with a flipping probability of 70% may have a 70% chance to be flipped and a 30% (i.e., 1-70%) chance not to be flipped. Merely by way of example, flipping tests are performed on the seven bit nodes and the result is shown as the flipping test result 650. The values (i.e., the hard decisions) of the bit nodes may be updated according to the flipping test result 650. For example, the first bit node, the third bit node, the fifth bit node, the sixth bit node, and the seventh bit node may be determined as target bit nodes that are required to be flipped (e.g., changing from "1" to "0", or "0" to "1"). As a result, an updated codeword 660 "0001101" is generated based on the initial codeword 610 "1011010".

Figure 7:
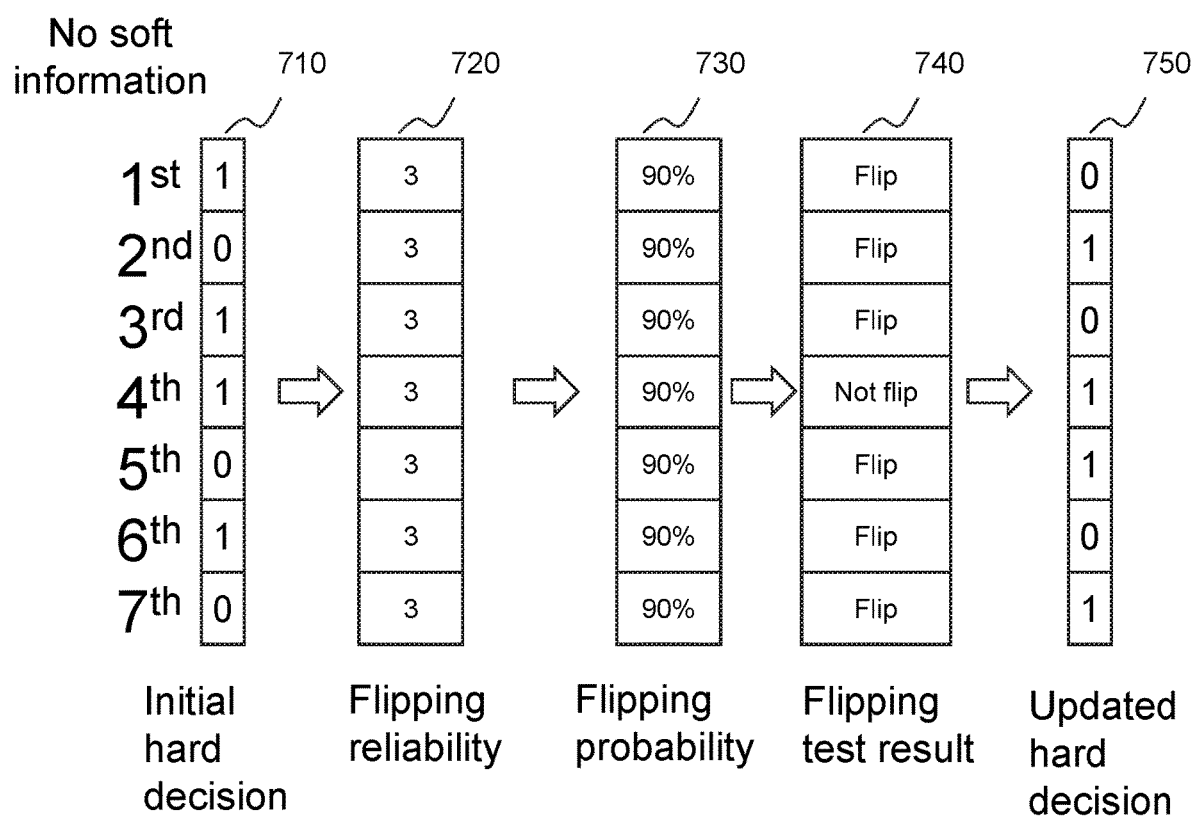
FIG. 7 is a schematic diagram illustrating an exemplary process for decoding a codeword according to some embodiments of the present disclosure.

FIG. 7 is a schematic diagram illustrating an exemplary process for decoding a received codeword according to some embodiments of the present disclosure. The process illustrated in FIG. 7 may correspond to the operation 560 in FIG. 5. As shown in FIG. 7, the initial codeword 710 may be "1011010" (e.g., same as the initial codeword 610 and the received codeword 240). In some embodiments, the initial syndrome weight of the initial codeword 710 may be greater than a syndrome weight threshold and the channel may not include soft information (e.g., initial reliabilities of the bit nodes). In such cases, a preset grade "3", which indicates that the bit node is extremely unreliable, may be designated as the flipping reliability 720 of each of the seven bit nodes.

In some embodiments, flipping probabilities 730 of the bit nodes may be determined based on the flipping reliabilities 720 of the bit nodes and a flipping rule, e.g., a relationship between the flipping reliability and the flipping probability. For example, the flipping rule may include a mapping between the flipping reliability of grade "3" and the flipping probability of 90%. Therefore, the flipping probabilities 730 of the bit nodes may all be determined as 90%. Similar to the process described in FIG. 6, flipping tests may be performed on the bit nodes according to their flipping probabilities 730 (i.e., 90%). Specifically, each bit is determined whether to be flipped individually. In the flipping tests, each bit node has a 90% chance to be flipped and a 10% (i.e., 1-90%) chance not to be flipped. Merely by way of example, flipping tests are performed on the seven bit nodes and the result is shown as the flipping test result 740. The values of the bit nodes may be updated according to the flipping test result 740. For example, the first bit node, the second bit node, the third bit node, the fifth bit node, the sixth bit node, and the seventh bit node may be determined as target bit nodes that are required to be flipped (e.g., changing from "1" to "0", or "0" to "1"). The fourth bit node may be unchanged. As a result, an updated codeword 750 "0101101" is generated based on the initial codeword 710 "1011010".

Figure 8:
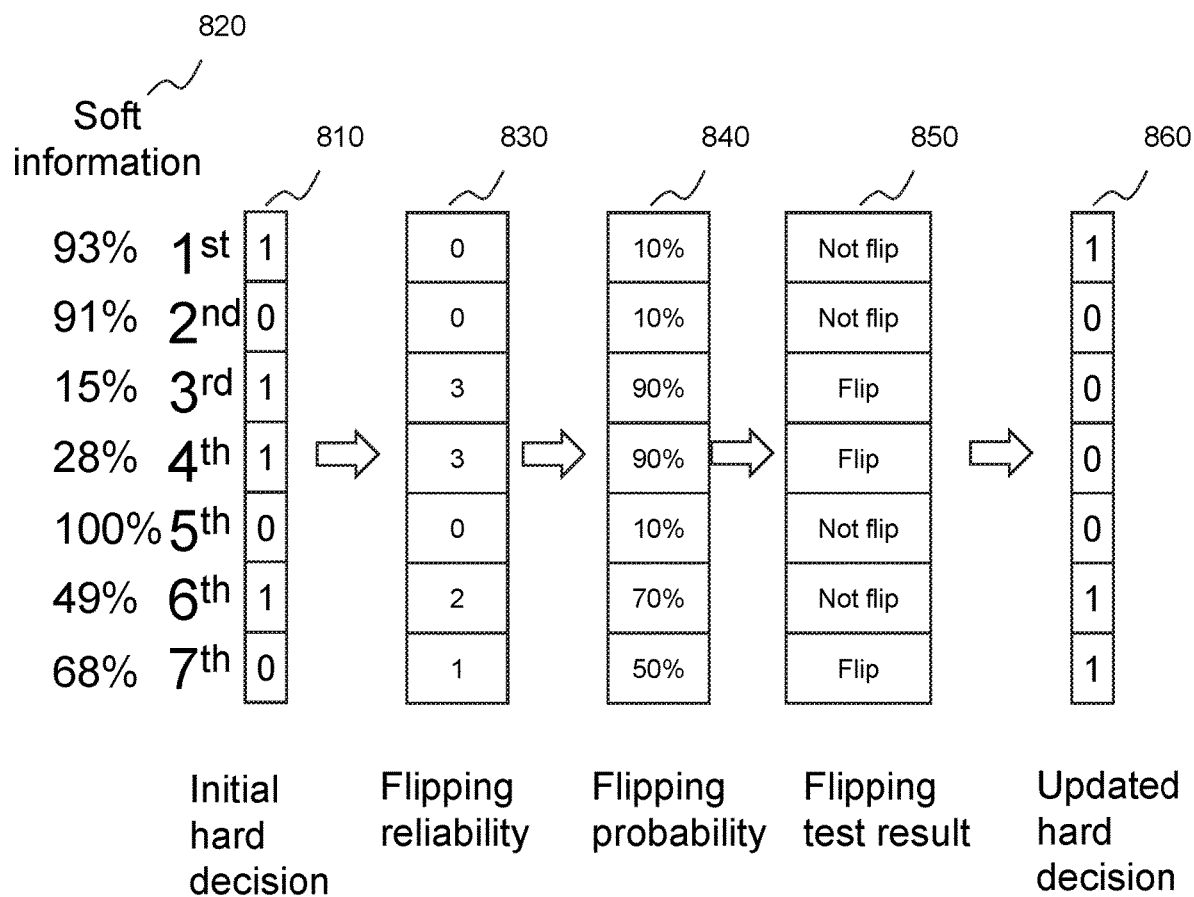
FIG. 8 is a schematic diagram illustrating an exemplary process for decoding a codeword according to some embodiments of the present disclosure.

FIG. 8 is a schematic diagram illustrating an exemplary process for decoding a codeword according to some embodiments of the present disclosure. The process illustrated in FIG. 8 may correspond to the operation 570 in FIG. 5. As shown in FIG. 8, the initial codeword 810 may be "1011010" (e.g., same as the initial codeword 610, the initial codeword 710, and the received codeword 240). In some embodiments, the initial syndrome weight of the initial codeword 810 may be greater than a syndrome weight threshold and the channel may provide soft information 820 (e.g., initial reliabilities of the bit nodes). As the initial syndrome weight is greater than the syndrome weight threshold, the initial codeword 810 is very unreliable. As soft information is available, the flipping reliabilities 830 of the seven bit nodes may be determined based on the soft information. For example, a relationship between the initial reliability and the flipping reliability may be obtained. The relationship may be represented by a linear function, a non-linear function, a continuous function, or a discrete function, or the like. According to the soft information 820 and the relationship exemplified in FIG. 10, the flipping reliabilities 830 of the seven bit nodes may be determined as "0033021".

Flipping probabilities 840 of the bit nodes may be determined based on the flipping reliabilities 830 and a flipping rule, e.g., a relationship between the flipping reliability and the flipping probability. For example, the flipping rule may include a mapping between the flipping reliability of grade "3", grade "2", grade "1", and grade "0" and the flipping probability of 90%, 70%, 50%, and 10%, respectively. Similar to the process described in FIG. 6 and FIG. 7, flipping tests may be performed on the bit nodes according to their flipping probabilities 840. Merely by way of example, flipping tests are performed on the seven bit nodes and the result is shown as the flipping test result 850. The values of the bit nodes may be updated according to the flipping test result 850. As a result, an updated codeword 860 "1000011" may be generated based on the initial codeword 810 "1011010".

Figure 9:
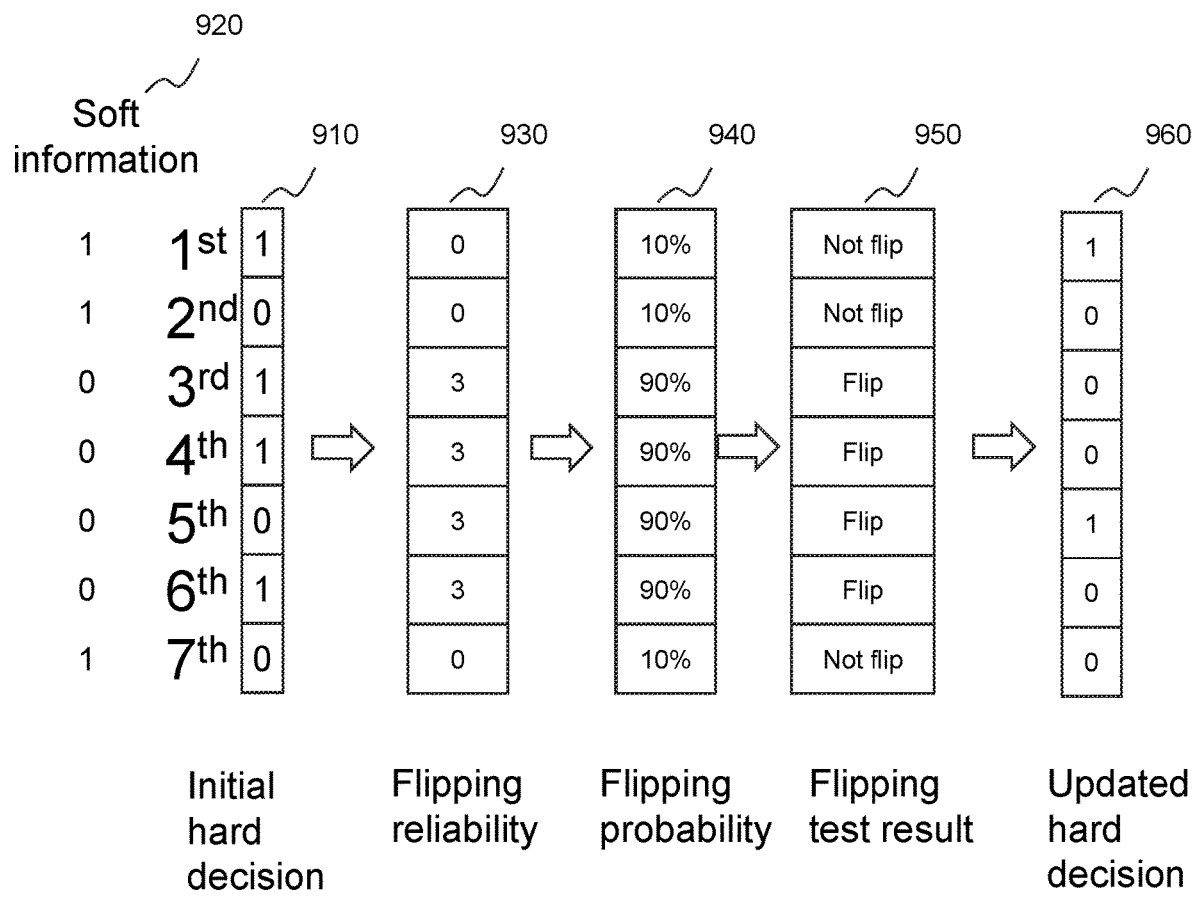
FIG. 9 is a schematic diagram illustrating an exemplary process for decoding a codeword according to some embodiments of the present disclosure.

FIG. 9 is a schematic diagram illustrating an exemplary process for decoding a codeword according to some embodiments of the present disclosure. The process illustrated in FIG. 9 may correspond to the operation 570 in FIG. 5. As shown in FIG. 9, the initial codeword 910 may be "1011010" (e.g., same as the initial codeword 610, the initial codeword 710, the initial codeword 810, and the received codeword 240). In some embodiments, the initial syndrome weight of the initial codeword 910 may be greater than a syndrome weight threshold and the channel may provide soft information 920. As the initial syndrome weight is greater than the syndrome weight threshold, the initial codeword 910 is very unreliable. As soft information is available, the flipping reliabilities 930 of the seven bit nodes may be determined based on the soft information.

Different from the soft information 820 shown in FIG. 8, the soft information 920 is represented by binary values "0" and "1". The value "1" may represent that the corresponding bit node is reliable (e.g., having a high initial reliability), and the value "0" may represent that the corresponding bit node is unreliable (e.g., having a low initial reliability). For example, the value "1" may correspond to a flipping reliability of grade "0", and the value "0" may correspond to a flipping reliability of grade "3". As a result, the flipping reliabilities 930 of the seven bit nodes may be determined as "0033330".

Flipping probabilities 940 of the bit nodes may be determined based on the flipping reliabilities 930 and a flipping rule, e.g., a relationship between the flipping reliability and the flipping probability. For example, the flipping rule may include a mapping between the flipping reliability of grade "3", grade "0" and the flipping probability of 90%, 10%, respectively. Similar to the process described in FIG. 6, FIG. 7 and FIG. 8, flipping tests may be performed on the bit nodes according to their flipping probabilities 940. Merely by way of example, flipping tests are performed on the seven bit nodes and the result is shown as the flipping test result 950. The values of the bit nodes may be updated according to the flipping test result 950. As a result, an updated codeword 960 "1000100" may be generated based on the initial codeword 910 "1011010".

It should be noted that the determination of flipping energies, flipping reliabilities, and/or flipping probabilities described in FIGS. 6-9 are based on that seven bit nodes are regarded as being in a same group (e.g., as described in the operation 420). However, other ways of bit nodes classification, e.g., each group including only one bit node, may also be used in the decoding processing of the present disclosure. It should be noted that the above descriptions are merely provided for the purposes of illustration, and not intended to limit the scope of the present disclosure. For persons having ordinary skills in the art, multiple variations and modifications may be made under the teachings of the present disclosure. However, those variations and modifications do not depart from the scope of the present disclosure. For example, the relationship between the flipping reliability and the flipping probability may be adjusted according to specific occasions. Merely by way of example, in a specific occasion of an SSD application, the flipping probability of any bit node may be either "0%" or "100%", depending on the flipping reliability of that bit node. For example, in the flipping rule described in connection with, e.g., FIGS. 6-9, the flipping reliability of grade "3" and grade "2" may both correspond to the flipping probability of 100%, and the flipping reliability of grade "1" and grade "0" may both correspond to the flipping probability of 0%. In such case, the flipping test as described in connection with FIGS. 6-9 may be omitted, and the bit nodes having the flipping probability of 100% may be directly determined as target bit nodes that are required to be flipped.

Figure 11:
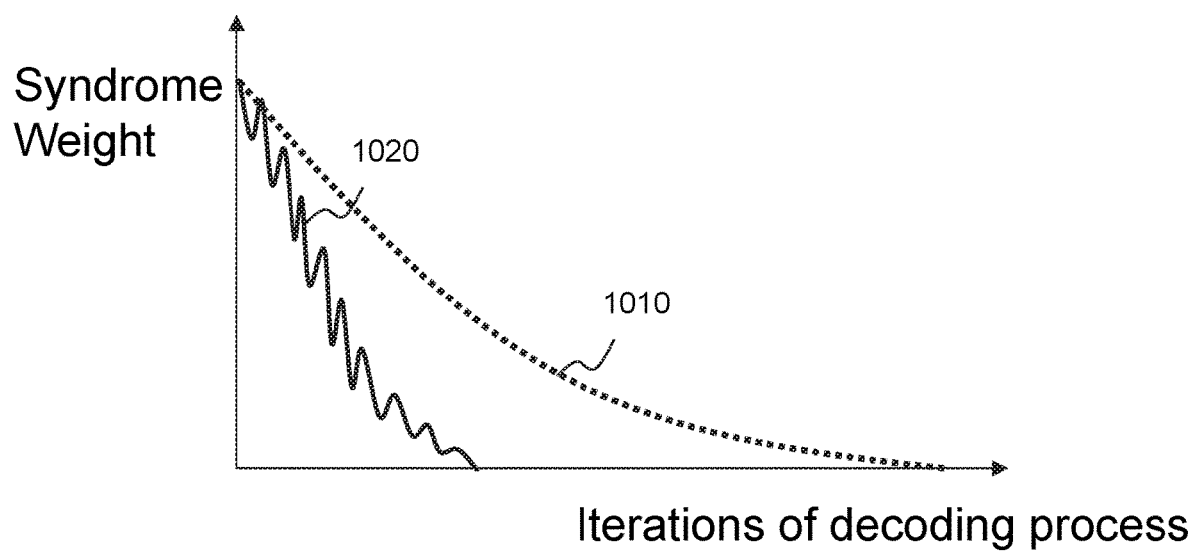
FIG. 11 is a schematic diagram illustrating an exemplary relationship between iterations of a decoding process and a syndrome weight according to some embodiments of the present disclosure.

FIG. 11 is a schematic diagram illustrating an exemplary relationship between iterations of the decoding process and a syndrome weight according to some embodiments of the present disclosure. As shown in FIG. 10, curve 1010 may correspond to a conventional bit-flipping method and curve 1020 may correspond to the improved bit-flipping method disclosed in the present disclosure. A conventional bit-flipping method decides whether to flip a bit node merely based on the flipping energy. If the flipping energy is greater than a threshold, the bit is flipped; otherwise, the bit is not flipped. Because of this, the randomness of the conventional bit-flipping method is low and the number of iterations of updating the codeword before the syndrome weight reaches zero may be large. In other words, the convergence speed may be low. In contrast, the improved bit-flipping method disclosed in the present disclosure introduces a use of flipping test that relates to flipping probabilities of the bit nodes. In a broad view of all the bit nodes, the flipping probabilities are positively related to the flipping energies, which is consistent with the conventional bit-flipping method. In a specific view of each individual bit node, a bit node with flipping probability of 10% may still have a chance to be flipped. Such design provides a small randomness while maintaining an overall accuracy. Therefore, when using the present method, much fewer iterations are required to converge.

Figure 12:
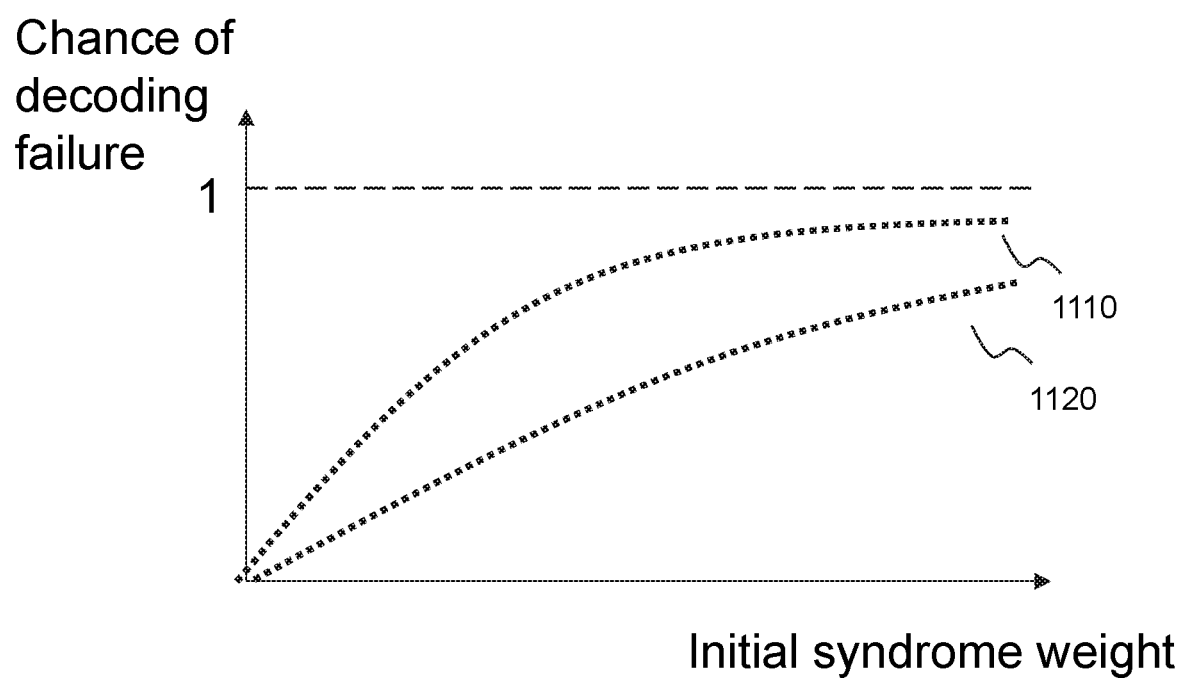
FIG. 12 is a schematic diagram illustrating an exemplary relationship between an initial syndrome weight and a chance of decoding failure according to some embodiments of the present disclosure.

FIG. 12 is a schematic diagram illustrating an exemplary relationship between an initial syndrome weight and a chance of decoding failure according to some embodiments of the present disclosure. As shown in FIG. 11, curve 1110 may correspond to a conventional bit-flipping method and curve 1120 may correspond to the improved bit-flipping method disclosed in the present disclosure. As mentioned above, the conventional bit-flipping method has a low randomness. If the initial syndrome weight is very large, the chance of decoding failure may be very high. In contrast, the improved bit-flipping method disclosed in the present disclosure provides a method of determining the flipping reliabilities of the bit nodes when the initial syndrome weight is very large (e.g., designating a preset flipping reliability or using soft information to determine the flipping reliability as illustrated in 560 and 570 in FIG. 5). Also, the present method provides a certain degree of randomness. Therefore, the chance of decoding failure is not greatly increased when initial syndrome weight increases. The higher error correction capability and the faster convergence speed of the present method may result in a less computing load in subsequent decoding process (e.g., using a min-sum decoder) and a faster overall speed of the LDPC decoder.

Having thus described the basic concepts, it may be rather apparent to those skilled in the art after reading this detailed disclosure that the foregoing detailed disclosure is intended to be presented by way of example only and is not limiting. Various alterations, improvements, and modifications may occur and are intended to those skilled in the art, though not expressly stated herein. These alterations, improvements, and modifications are intended to be suggested by this disclosure, and are within the spirit and scope of the exemplary embodiments of this disclosure.

Moreover, certain terminology has been used to describe embodiments of the present disclosure. For example, the terms "one embodiment," "an embodiment," and/or "some embodiments" mean that a particular feature, structure or characteristic described in connection with the embodiment is included in at least one embodiment of the present disclosure. Therefore, it is emphasized and should be appreciated that two or more references to "an embodiment" or "one embodiment" or "an alternative embodiment" in various portions of this specification are not necessarily all referring to the same embodiment. Furthermore, the particular features, structures or characteristics may be combined as suitable in one or more embodiments of the present disclosure.

Further, it will be appreciated by one skilled in the art, aspects of the present disclosure may be illustrated and described herein in any of a number of patentable classes or context including any new and useful process, machine, manufacture, or composition of matter, or any new and useful improvement thereof. Accordingly, aspects of the present disclosure may be implemented entirely hardware, entirely software (including firmware, resident software, micro-code, etc.) or combining software and hardware implementation that may all generally be referred to herein as a "unit," "module," or "system." Furthermore, aspects of the present disclosure may take the form of a computer program product embodied in one or more computer readable media having computer readable program code embodied thereon.

A computer readable signal medium may include a propagated data signal with computer readable program code embodied therein, for example, in baseband or as part of a carrier wave. Such a propagated signal may take any of a variety of forms, including electro-magnetic, optical, or the like, or any suitable combination thereof. A computer readable signal medium may be any computer readable medium that is not a computer readable storage medium and that may communicate, propagate, or transport a program for use by or in connection with an instruction execution system, apparatus, or device. Program code embodied on a computer readable signal medium may be transmitted using any appropriate medium, including wireless, wireline, optical fiber cable, RF, or the like, or any suitable combination of the foregoing.

Computer program code for carrying out operations for aspects of the present disclosure may be written in any combination of one or more programming languages, including an object oriented programming language such as Java, Scala, Smalltalk, Eiffel, JADE, Emerald, C++, C#, VB. NET, Python or the like, conventional procedural programming languages, such as the "C" programming language, Visual Basic, Fortran 2003, Perl, COBOL 2002, PHP, ABAP, dynamic programming languages such as Python, Ruby and Groovy, or other programming languages. The program code may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider) or in a cloud computing environment or offered as a service such as a Software as a Service (SaaS).

Furthermore, the recited order of processing elements or sequences, or the use of numbers, letters, or other designations therefore, is not intended to limit the claimed processes and methods to any order except as may be specified in the claims. Although the above disclosure discusses through various examples what is currently considered to be a variety of useful embodiments of the disclosure, it is to be understood that such detail is solely for that purpose, and that the appended claims are not limited to the disclosed embodiments, but, on the contrary, are intended to cover modifications and equivalent arrangements that are within the spirit and scope of the disclosed embodiments. For example, although the implementation of various components described above may be embodied in a hardware device, it may also be implemented as a software only solution, e.g., an installation on an existing server or mobile device.

Similarly, it should be appreciated that in the foregoing description of embodiments of the present disclosure, various features are sometimes grouped together in a single embodiment, figure, or description thereof for the purpose of streamlining the disclosure aiding in the understanding of one or more of the various embodiments. This method of disclosure, however, is not to be interpreted as reflecting an intention that the claimed subject matter requires more features than are expressly recited in each claim. Rather, claimed subject matter may lie in less than all features of a single foregoing disclosed embodiment.

What is claimed is:

1. A system for decoding a received codeword, comprising:
    at least one storage device storing executable instructions, and
    at least one processor in communication with the at least one storage device, wherein when executing the executable instructions, the at least one processor causes the system to perform operations including:
    receiving a codeword through a channel, the received codeword including a plurality of bits;
    obtaining a parity check matrix defining relationships between a plurality of bit nodes and a plurality of check nodes, each bit node corresponding to one of the plurality of bits; and
    decoding the received codeword by estimating values with respect to the codeword at the plurality of bit nodes and the plurality of check nodes in an iterative process including one or more iterations, wherein at least one iteration of the one or more iterations includes:
        determining a syndrome weight based on current values of the plurality of bit nodes and the parity check matrix;
        determining whether the syndrome weight is equal to zero;
        in response to determining that the syndrome weight is not equal to zero, determining one or more flipping reliabilities of the plurality of bit nodes, each flipping reliability representing a reliability of a flipping operation on one of the plurality of bit nodes, wherein the determining one or more flipping reliabilities of the plurality of bit nodes comprises:
            for each of the plurality of bit nodes,
            determining a flipping energy;
            obtaining at least one flipping energy threshold;
            comparing the flipping energy with the at least one flipping energy threshold; and
            determining the flipping reliability of the bit node based on a result of the comparison; and
        determining, among the plurality of bit nodes, at least one target bit node that is required to be flipped based on the one or more flipping reliabilities of the plurality of bit nodes; and
        flipping the at least one target bit node to update the current values of the plurality of bit nodes.

2. The system of claim 1, wherein the determining, among the plurality of bit nodes, at least one target bit node that is required to be flipped comprises:
    determining one or more flipping probabilities of the plurality of bit nodes, each flipping probability corresponding to one of the plurality of bit nodes;
    for each of the plurality of bit nodes, performing a test according to its corresponding flipping probability to determine whether the bit node is required to be flipped, wherein in the test, the bit node has a first probability equal to the flipping probability to be flipped; and
    determining the at least one target bit node that is required to be flipped according to a result of the test.

3. The system of claim 2, wherein the determining one or more flipping probabilities of the plurality of bit nodes comprises:
    obtaining a flipping rule, the flipping rule including a relationship between the flipping reliability and the flipping probability of a same bit node; and
    for each of the plurality of bit nodes, determining the flipping probability of the bit node based on the flipping rule and the corresponding flipping reliability of the bit node.

4. The system of claim 1, wherein the determining one or more flipping reliabilities of the plurality of bit nodes comprises:
    determining whether the syndrome weight is greater than a syndrome weight threshold; and
    in response to determining that the syndrome weight is greater than the syndrome weight threshold,
    designating a preset flipping reliability as the one or more flipping reliabilities of the plurality of bit nodes.

5. The system of claim 1, wherein the channel provides soft information including an initial probability of each of the plurality of bit nodes, and the determining one or more flipping reliabilities of the plurality of bit nodes comprises:
    determining whether the syndrome weight is greater than a syndrome weight threshold; and
    in response to determining that the syndrome weight is greater than the syndrome weight threshold,
    for each of the plurality of bit nodes, determining the flipping reliability of the bit node based on its initial probability.

6. The system of claim 1, wherein, for each of the plurality of bit node, the flipping energy relates to a function of values of check nodes that are connected to the bit node.

7. The system of claim 1, wherein a flipping energy threshold corresponding to a specific bit node has different values in different iterations.

8. The system of claim 1, wherein, a value of the at least one flipping energy threshold corresponding to a specific bit node is determined according to at least one of:
an index of the specific bit node, channel mismatch information, a count of check nodes connected to the specific bit node, an iteration number, a count of the at least one target bit node in a previous iteration, the syndrome weight in a current iteration, or a syndrome weight in a previous iteration.

9. The system of claim 1, wherein different bit nodes correspond to different values of the at least one flipping energy threshold.

10. The system of claim 1, wherein the system is used in a solid state drive (SSD) controller for decoding a low-density parity-check (LDPC) code.

11. A method for decoding a received codeword, comprising: comprising:
receiving a codeword through a channel, the received codeword including a plurality of bits;
obtaining a parity check matrix defining relationships between a plurality of bit nodes and a plurality of check nodes, each bit node corresponding to one of the plurality of bits; and
decoding the received codeword by estimating values with respect to the codeword at the plurality of bit nodes and the plurality of check nodes in an iterative process including one or more iterations, wherein at least one iteration of the one or more iterations includes:
determining a syndrome weight based on current values of the plurality of bit nodes and the parity check matrix;
determining whether the syndrome weight is equal to zero;
in response to determining that the syndrome weight is not equal to zero, determining one or more flipping reliabilities of the plurality of bit nodes, each flipping reliability representing a reliability of a flipping operation on one of the plurality of bit nodes, wherein the determining one or more flipping reliabilities of the plurality of bit nodes comprises:
for each of the plurality of bit nodes,
determining a flipping energy;
obtaining at least one flipping energy threshold;
comparing the flipping energy with the at least one flipping energy threshold; and
determining the flipping reliability of the bit node based on a result of the comparison; and
determining, among the plurality of bit nodes, at least one target bit node that is required to be flipped based on the one or more flipping reliabilities of the plurality of bit nodes; and
flipping the at least one target bit node to update the current values of the plurality of bit nodes.

12. The method of claim 11, wherein the determining, among the plurality of bit nodes, at least one target bit node that is required to be flipped comprises:
determining one or more flipping probabilities of the plurality of bit nodes, each flipping probability corresponding to one of the plurality of bit nodes;
for each of the plurality of bit nodes, performing a test according to its corresponding flipping probability to determine whether the bit node is required to be flipped, wherein in the test, the bit node has a first probability equal to the flipping probability to be flipped; and
determining the at least one target bit node that is required to be flipped according to a result of the test.

13. The method of claim 12, wherein the determining one or more flipping probabilities of the plurality of bit nodes comprises:
obtaining a flipping rule, the flipping rule including a relationship between the flipping reliability and the flipping probability of a same bit node; and
for each of the plurality of bit nodes, determining the flipping probability of the bit node based on the flipping rule and the corresponding flipping reliability of the bit node.

14. The method of claim 11, wherein the determining one or more flipping reliabilities of the plurality of bit nodes comprises:
determining whether the syndrome weight is greater than a syndrome weight threshold; and
in response to determining that the syndrome weight is greater than the syndrome weight threshold,
designating a preset flipping reliability as the one or more flipping reliabilities of the plurality of bit nodes.

15. The method of claim 11, wherein the channel provides soft information including an initial probability of each of the plurality of bit nodes, and the determining one or more flipping reliabilities of the plurality of bit nodes comprises:
determining whether the syndrome weight is greater than a syndrome weight threshold; and
in response to determining that the syndrome weight is greater than the syndrome weight threshold,
for each of the plurality of bit nodes, determining the flipping reliability of the bit node based on its initial probability.

16. The method of claim 11, wherein, for each of the plurality of bit node, the flipping energy relates to a function of values of check nodes that are connected to the bit node.

17. The method of claim 11, wherein a flipping energy threshold corresponding to a specific bit node have different values in different iterations.

18. A non-transitory computer readable medium, comprising executable instructions that, when executed by at least one processor, direct the at least one processor to perform a method, the method comprising:
receiving a codeword through a channel, the received codeword including a plurality of bits;
obtaining a parity check matrix defining relationships between a plurality of bit nodes and a plurality of check nodes, each bit node corresponding to one of the plurality of bits; and
decoding the received codeword by estimating values with respect to the codeword at the plurality of bit nodes and the plurality of check nodes in an iterative process including one or more iterations, wherein at least one iteration of the one or more iterations includes:
determining a syndrome weight based on current values of the plurality of bit nodes and the parity check matrix;
determining whether the syndrome weight is equal to zero;
in response to determining that the syndrome weight is not equal to zero, determining one or more flipping reliabilities of the plurality of bit nodes, each flipping reliability representing a reliability of a flipping operation on one of the plurality of bit nodes, each flipping reliability corresponding to a flipping probability, wherein the determining one or more flipping reliabilities of the plurality of bit nodes comprises:
for each of the plurality of bit nodes,
determining a flipping energy;

obtaining at least one flipping energy threshold;
comparing the flipping energy with the at least one flipping energy threshold; and
determining the flipping reliability of the bit node based on a result of the comparison; and
determining, among the plurality of bit nodes, at least one target bit node that is required to be flipped based on the one or more flipping reliabilities and the corresponding flipping probabilities of the plurality of bit nodes; and
flipping the at least one target bit node to update the current values of the plurality of bit nodes.

* * * * *